United States Patent
Plat et al.

(10) Patent No.: US 7,052,921 B1
(45) Date of Patent: May 30, 2006

(54) SYSTEM AND METHOD USING IN SITU SCATTEROMETRY TO DETECT PHOTORESIST PATTERN INTEGRITY DURING THE PHOTOLITHOGRAPHY PROCESS

(75) Inventors: Marina V. Plat, San Jose, CA (US); Bhanwar Singh, Morgan Hill, CA (US); Calvin T. Gabriel, Cupertino, CA (US); Christopher F. Lyons, Fremont, CA (US); Scott A. Bell, San Jose, CA (US); Ramkumar Subramanian, Sunnyvale, CA (US); Srikanteswara Dakshina-Murthy, Wappingers Falls, NY (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/934,192

(22) Filed: Sep. 3, 2004

(51) Int. Cl.
*H01L 21/66* (2006.01)

(52) U.S. Cl. ...................................................... 438/14

(58) Field of Classification Search .................. 438/5, 438/6, 7, 14, 16, 29, 34, 35, 106, 107, 142, 438/149, 584
See application file for complete search history.

(56) References Cited

U.S. PATENT DOCUMENTS

| | | | |
|---|---|---|---|
| 5,739,909 A | 4/1998 | Blayo et al. | |
| 6,383,824 B1 | 5/2002 | Lensing | |
| 6,433,878 B1 | 8/2002 | Niu et al. | |
| 6,451,621 B1 | 9/2002 | Rangarajan et al. | |
| 6,537,833 B1 | 3/2003 | Lensing | |
| 6,545,753 B1 | 4/2003 | Subramanian et al. | |
| 6,558,965 B1 | 5/2003 | Singh et al. | |
| 6,562,635 B1 | 5/2003 | Lensing et al. | |
| 6,579,733 B1 | 6/2003 | Rangarajan et al. | |
| 6,589,804 B1 | 7/2003 | Halliyal et al. | |

(Continued)

OTHER PUBLICATIONS

Andrew H. Shih, Scatterometry-based critical dimension and profile metrology, Sep. 16, 2002.

(Continued)

*Primary Examiner*—Michael Lebentritt
*Assistant Examiner*—Andre' Stevenson
(74) *Attorney, Agent, or Firm*—Renner, Otto, Boisselle and Sklar, LLP

(57) ABSTRACT

The present invention uses in situ scatterometry to determine if a defect (e.g., photoresist erosion, photoresist bending and pattern collapse) is present on a wafer. In one embodiment, in situ scatterometry is used to detect a pattern integrity defect associated with the layer of photoresist. In situ scatterometry produces diffraction data associated with the thickness of the photoresist patterned mask. This data is compared to a model of diffraction data associated with a suitable photoresist thickness. If the measured diffraction data is within an acceptable range, the next step of the photolithography process is carried out. However, if the measured thickness is outside of the suitable range, a defect is detected, and the wafer may be sent for re-working or re-patterned prior to main etch, thereby preventing unnecessary wafer scrap. Another aspect of the present invention allows for a feedback control mechanism to alter a physical parameter of the photolithographic process based upon the in situ scatterometry measurements.

12 Claims, 5 Drawing Sheets

U.S. PATENT DOCUMENTS

| | | |
|---|---|---|
| 6,594,024 B1 | 7/2003 | Singh et al. |
| 6,602,723 B1 | 8/2003 | Markle |
| 6,602,727 B1 | 8/2003 | Rangarajan |
| 6,614,540 B1 | 9/2003 | Stirton |
| 6,630,361 B1 | 10/2003 | Singh et al. |
| 6,639,663 B1 | 10/2003 | Markle et al. |
| 6,643,557 B1 | 11/2003 | Miller et al. |
| 6,650,422 B1 | 11/2003 | Singh et al. |
| 6,650,423 B1 | 11/2003 | Markle et al. |
| 6,673,638 B1 * | 1/2004 | Bendik et al. ............ 438/14 |
| 6,677,170 B1 | 1/2004 | Markle |
| 6,704,101 B1 | 3/2004 | Rangarajan et al. |
| 6,707,562 B1 | 3/2004 | Lensing |
| 6,716,646 B1 | 4/2004 | Wright et al. |
| 6,727,995 B1 | 4/2004 | Halliyal et al. |
| 6,742,168 B1 | 5/2004 | Nariman |
| 6,771,356 B1 | 8/2004 | Lyons et al. |
| 6,786,983 B1 | 9/2004 | Szymanowski et al. |
| 2002/0102749 A1 * | 8/2002 | Fielden ............ 438/14 |

OTHER PUBLICATIONS

Andrew H. Shih, High Performance scatterometry for key dimension metrology, Jul. 17, 2002.

Xinhui Niu, Spectral Scatterometry for CD Control.

John R. (Bob) McNeil, Scatterometry Applied to Microelectronics Processing.

Xinhui Niu, Nickhil Jakatdar, Junwei Bao, and Costas J. Spanos, Specular Spectroscopic Scatterometry, 2001 IEEE.

K.J. Stanley, Timothy D. Stanley and Jose' Maia, Realizing 300MMM FAB Productivity Improvements Through Integrated Metrology.

Xinhui Niu, Nickhil Jakatdar, Junwei Bao, Costas J. Spanos and Sanjay Yedur, Specular Spectroscopic Scatterometry in DUV Lithography.

US 6,549,287, 04/2003, Lensing (withdrawn)

* cited by examiner

SYSTEM AND METHOD USING IN SITU SCATTEROMETRY TO DETECT PHOTORESIST PATTERN INTEGRITY DURING THE PHOTOLITHOGRAPHY PROCESS

BACKGROUND OF THE INVENTION

1. Technical Field

The present invention relates generally to the field of semiconductor fabrication. In particular, the present invention relates to a system and method for using in situ scatterometry to detect pattern integrity defect during the fabrication process.

2. Description of the Related Art

The semiconductor industry is constantly striving to increase the operating speed of integrated circuit devices, e.g., microprocessors, memory devices, and the like. The semiconductor industry is fueled by developer and consumer demand for computers and electronic devices that operate at increasingly greater speeds. This demand for increased speed has resulted in a continual reduction in the size of semiconductor devices, e.g., transistors. Thus, there is a constant drive to reduce the size of the components of a typical transistor in order to increase the overall speed of the transistor.

An exemplary field effect transistor 10 is shown in FIG. 1. The transistor 10 includes the following components: a wafer body 12, a surface of the wafer body 12A, a gate electrode 14, a gate insulator 16, a source 18, a drain 20, and isolation regions 22. The wafer body 12 is typically comprised of appropriately doped Silicon (Si), Gallium Arsenide (GaAs) or Geranium (Ge). By way of example, common dopants for Silicon include Phosphorous (P) and Arsenic (As) as N-type transistors and Boron (B) for P-type transistors. In the process of forming integrated circuit devices, millions of transistors are formed on the surface of the wafer body 12A. The wafer body 12 may be doped with either N-type or P-type dopant materials. The transistor 10 may have a doped polycrystalline silicon (polysilicon) gate electrode 14 formed above a gate insulation layer 16. The source 18 and the drain 20 elements of the transistor 10 may be formed by performing one or more ion implantation processes to introduce dopant atoms into the wafer body 12. Isolation regions 22 may be provided to isolate the transistor 10 electrically from neighboring semiconductor devices, such as other transistors located within the wafer body 12 (not shown).

In addition, although not shown in FIG. 1, a typical integrated circuit device is comprised of a plurality of conductive interconnections, commonly referred to as conductive lines or vias, positioned in multiple layers of insulating material formed above the wafer body 12. These conductive interconnections allow electrical signals to propagate between the transistors formed above the wafer body 12.

Due to the complexity and the microscopic size of these transistors, there are many dimensions that are critical for the fabrication process, e.g., the width of the gate electrode 14, conductive lines, openings in insulating layers to allow subsequent formation of a conductive interconnection, i.e., a conductive line or contact, therein, etc. In general, semiconductor manufacturing operations involve, among other things, the formation of layers of various materials, e.g., polysilicon, metals, insulating materials, etc., and the selective removal of portions of those layers by performing known photolithographic and etching techniques. These processes are repeated until such time as the integrated circuit device is complete.

During the course of fabricating such integrated circuit devices, a variety of features, e.g., gate electrodes, conductive lines, openings in layers of insulating material, etc., are formed to very precisely controlled dimensions. Such dimensions are sometimes referred to as the critical dimension (CD) of the feature. Due to the complexity and reduced size of these devices, it is very important that these features be formed as accurately as possible. For example, the width of the gate electrode 14 corresponds approximately to the channel length 24 of the transistor 10 when it is operational. Accordingly, even slight variations in the actual dimension of this feature as fabricated may adversely affect device performance. Thus, there is a great need for a system and method that may be used to accurately, reliably and repeatedly troubleshoot and form features to their desired critical dimension.

Photolithography is a process commonly employed in semiconductor manufacturing. Photolithography generally involves forming a layer of photoresist material (positive or negative) above one or more layers of material, e.g., polysilicon, silicon dioxide, that are desired to be patterned. Thereafter, a pattern that is desired to be formed in the underlying layer or layers of material is initially formed in the layer of photoresist using an appropriate stepper or scanning tool and known photolithographic techniques, i.e., an image on a reticle in the stepper tool is transferred to the layer of photoresist. Then, the layer of photoresist is developed so as to leave in place a patterned layer of photoresist substantially corresponding to the pattern on the reticle. This patterned layer of photoresist is then used as a mask in subsequent etching processes, wet or dry, performed on the underlying layer or layers of material, e.g., a layer of polysilicon, metal or insulating material, to transfer the desired pattern to the underlying layer. The patterned layer of photoresist is comprised of a plurality of features, e.g., line-type features or opening-type features that are to be replicated in an underlying process layer. The features in the patterned layer of photoresist also have a critical dimension, sometimes referred to as a develop inspect critical dimension (DICD).

In one exemplary embodiment, modern photolithography processes generally involve the steps of: (1) applying a layer of photoresist above a wafer, typically accomplished by a spin-coating process; (2) pre-baking (or soft-baking) the layer of photoresist at a temperature of approximately 90–120 degree Celsius to reduce the level of solvents in the layer of photoresist and to improve the adhesion characteristics of the photoresist; (3) performing an exposure process, wherein a pattern is projected onto the layer of photoresist through a reticle used in a stepper tool to create a latent image in the layer of photoresist; (4) performing a post-exposure bake on the layer of photoresist at a temperature approximately 5–15 degree Celsius higher than the pre-bake process; (5) performing a develop process to turn the latent image in the layer of photoresist into the final photoresist image; and (6) performing a post-bake process (or hard-bake) at a temperature of approximately 125–160 degree Celsius to remove residual solids, improve adhesion, and to increase the etch resistance of the photoresist.

Due the pervasive trend in the art of IC fabrication to increase the density with which various structures are arranged, there is a corresponding need to increase the resolution capability of photolithography systems. To accomplish this goal, relatively short wavelengths (e.g., less than about 258 nm) have been used for the illumination light source. In conjunction with these relatively short wavelengths, ultra thin resists (UTR) have been used. For example, many applications include the use of photoresist layers that have a thickness of about 0.1 micron or thinner.

Further background for the present invention will now be described with reference to FIGS. 2 and 3. As shown in FIG. 2, a process layer 26 is formed above a wafer body 12 (or other previously-formed process layer) and a layer of photoresist material 28 (positive or negative) is formed above the process layer 26. The process layer 26 is meant to be illustrative of any type of material that may be patterned using known photolithographic and etching techniques. Using known photolithographic techniques, the layer of photoresist material 28 is patterned to define a plurality of photoresist features 28A that are intended to be used as a mask in patterning the underlying process layer 26 as illustrated in FIG. 3. This mask is also referred to herein as a patterned photoresist mask.

For a variety of reasons, the photolithography process described above may result in imperfect semiconductor fabrication. Common problems associated with semiconductor fabrication are photoresist erosion, photoresist bending and pattern collapse. As semiconductors continue to shrink, the photolithography requirements become much more demanding. A consequence of this is photoresists that are thinner and inherently less resistant to erosion by the etching process. Likewise, photoresist bending and the collapse of photolithographic patterns occur during the etch process when a rinse solution, usually water, is removed from the surface in a spin drying step. As the water is removed, capillary forces, caused by the surface tension of water between densely packed photoresist features, cause the pattern to bend and in some instances to ultimately collapse. In general, capillary forces increase as the separation between photoresist features decreases. Since the minimum distance between lithographic features has been predicted to decrease from 180 nm in 1999 to 100 nm in 2009, the bending and collapse of photoresist features is expected to have a significant impact on the next generation of semiconductors.

Photoresist erosion, photoresist bending and pattern collapse during the photolithography process result in significant defects in the semiconductor and possibly result in the scrapping of the underlying wafer bodies. FIG. 4A illustrates a cross-sectional view of a mask as applied. Various gate electrodes 14 are shown having corresponding channel lengths 34 formed on wafer 12 and process layer 26. FIG. 4B illustrates a top view of the ideal desired gate channel 34. FIG. 4C illustrates an incomplete gate channel formation due to insufficient photoresist or photoresist profile problems. Likewise, FIG. 4D illustrates incomplete gate channel formation due to photoresist bending and/or pattern collapse.

The cause of many of the problems mentioned above arises directly from the photolithography process. For example, photolithography processes using 248 nm exposure tools can be used to develop photoresist patterned masks with critical dimensions typically-down to 180 nm at best. Advanced exposure tools and photoresist formulas are required to routinely achieve critical dimensions of 150 nm or less. However, logic applications often require smaller gate width dimensions, necessitating further trimming of the developed photoresist before the photoresist pattern is transferred to the underlying film. This process is typically referred to as trim etch. As shown in FIG. 5, the photoresist line 30 on substrate 31 has a width denoted by DICD. The width of photoresist line 30 is wider than the desired gate to be formed, as illustrated by the dashed line. For example, a typical deep-UV stepper in certain embodiments provides reliable resolution capabilities down to 0.25 µm. To provide for gate width that is less than 0.25 µm, the 0.25 µm wide photoresist line is isotropically etched in a controlled manner in a high-density plasma etching system, to provide etching in horizontal directions $A_1$, $A_2$ along with etching in the vertical direction B, until a narrower final line, having a final critical dimension (FICD), remains.

Since a photoresist line with a relatively large DICD requires a relatively long trim etch time to achieve a given FICD, a significant amount of the photoresist is normally etched away in a vertical direction B, resulting in a substantial weakening and thinning of the photoresist 30. This significant reduction of the vertical dimension or thickness of the photoresist 30 from its untrimmed vertical dimension can promote discontinuity thereof, resulting in the photoresist 30 being incapable of providing effective masking in the fabrication of the gate. As in the case of a relatively small DICD, a photoresist with a small vertical photoresist dimension is required in order to prevent pattern collapse and/or bending caused by the capillary forces (discussed above), due to an undesirably high aspect ratio ("AR"), i.e., height/width ratio, of the partially etched photoresist structure.

Thus, there is a strong need in the art for a system and method to detect defects in pattern integrity prior to main etch thereby preventing or substantially reducing the need to scrap wafer bodies.

SUMMARY OF THE INVENTION

The present invention is directed a system and method that uses in situ scatterometry to detect defects in pattern integrity during the photolithography process, prior to main etch, thereby preventing or substantially reducing the need to scrap wafer bodies. In one embodiment, the present invention is directed to a system and method using in situ scatterometry to detect a defect in the patterned photoresist mask during the photolithography process.

In one embodiment, the present invention relates to a method of forming a semiconductor device including forming a process layer above a wafer body; forming a layer of photoresist above the process layer; imaging the layer of photoresist with a patterned mask; exposing the layer of photoresist to leave an impression of the patterned mask on the layer of photoresist; developing the layer of photoresist to form a patterned photoresist mask; performing an in situ scatterometry measurement on at least a portion of the patterned photoresist mask to produce measurement diffraction data; and predicting a defect associated with the patterned photoresist mask by comparing the measurement diffraction data to a model of diffraction data based upon a predicted thickness associated with the patterned photoresist mask and determining if the predicted thickness is within a suitable thickness range.

In another embodiment, the present invention relates to a system for forming a semiconductor device including a photolithographic tool for forming a patterned photoresist mask above a process layer; a scatterometry tool including a light source for illuminating a portion of the associated wafer and a detector for detecting the light reflected off of the portion of the associated wafer and producing measurement diffraction data; a computation tool for receiving measurement diffraction data, wherein the computation tool compares the measurement diffraction data to a model of diffraction data; and a controller which transmits a control signal to the photolithography tool based upon the comparison of the measurement diffraction data to the model of diffraction data received from the computation tool.

Other systems, methods, features, and advantages of the present invention will be or become apparent to one with skill in the art upon examination of the following drawings and detailed description. It is intended that all such additional systems, methods, features, and advantages be included within this description, be within the scope of the present invention, and be protected by the accompanying claims.

BRIEF DESCRIPTION OF DRAWINGS

Many aspects of the invention can be better understood with reference to the following drawings. The components in the drawings are not necessarily to scale, emphasis instead being placed upon clearly illustrating the principles of the present invention. Likewise, elements and features depicted in one drawing may be combined with elements and features depicted in additional drawings. Moreover, in the drawings, like reference numerals designate corresponding parts throughout the several views.

DETAILED DESCRIPTION OF THE INVENTION

Figure 1:
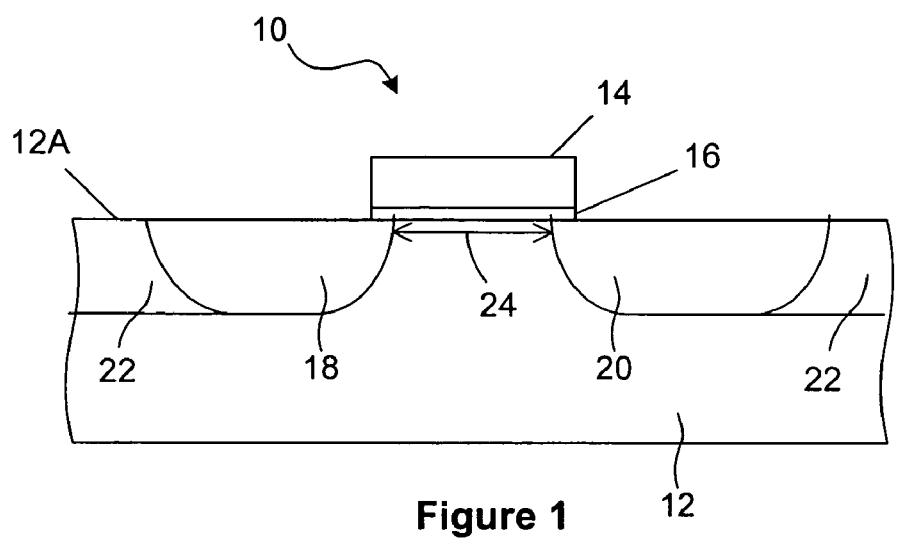
FIG. 1 is a cross-sectional view of an exemplary field effect transistor.
Figure 2:
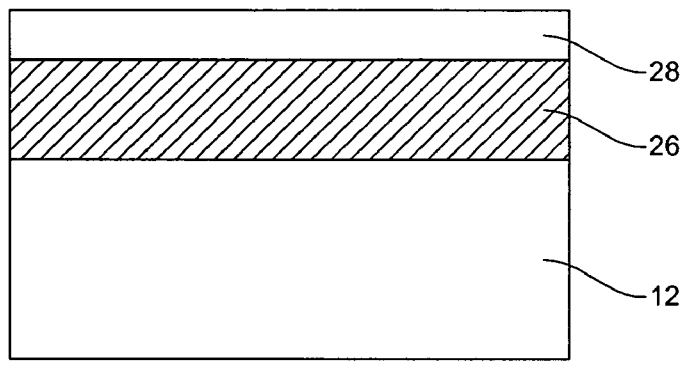
FIG. 2 is a cross-sectional view of a process layer having a layer of photoresist formed thereon.
Figure 3:
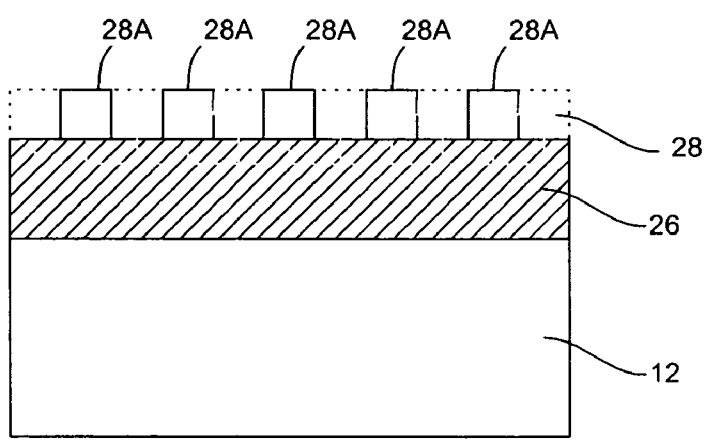
FIG. 3 is a cross-sectional view of a process layer having a layer of developed photoresist (patterned photoresist mask) formed thereon.
Figure 4A:
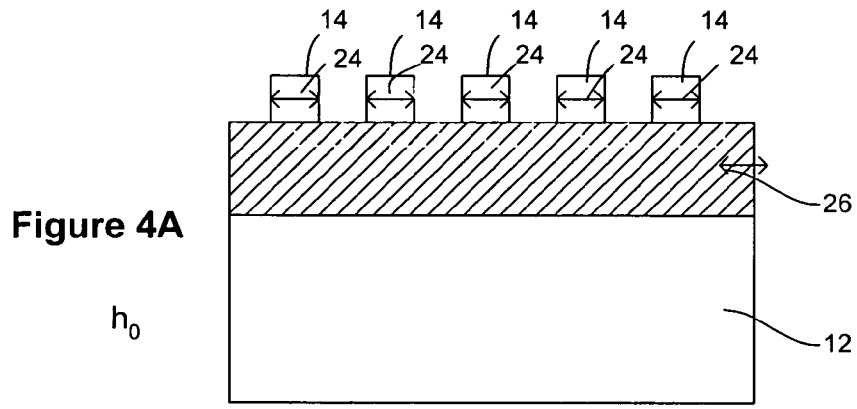
FIG. 4A is a cross-sectional view of an ideal field effect transistor.
Figure 4B:
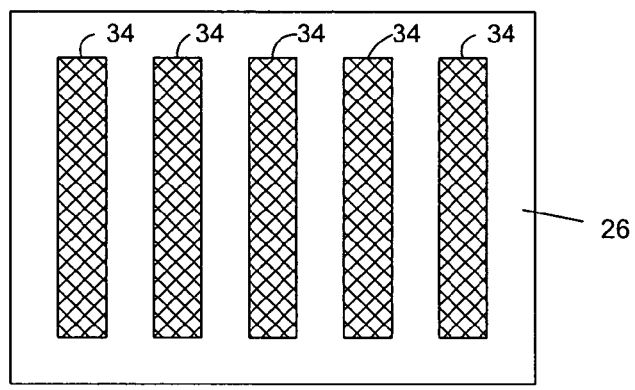
FIG. 4B is a top view of an ideal field effect transistor illustrating an ideal gate channel formed.
Figure 4C:
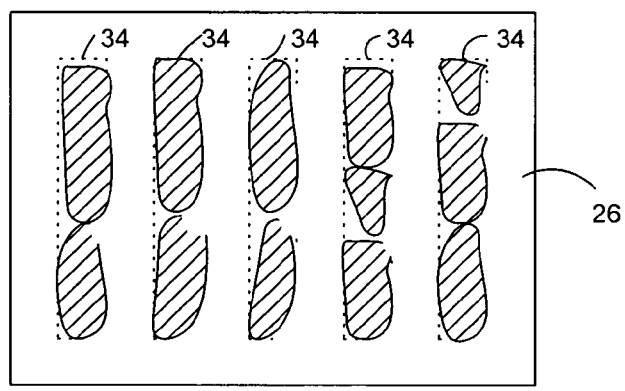
FIGS. 4C and 4D are top views of an ideal field effect transistor illustrating photoresist defects.
Figure 4D:
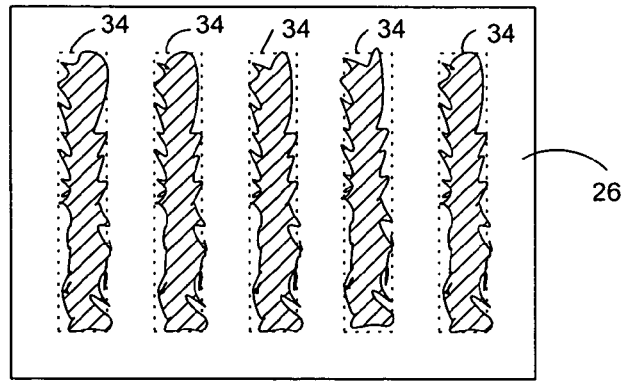
Figure 5:
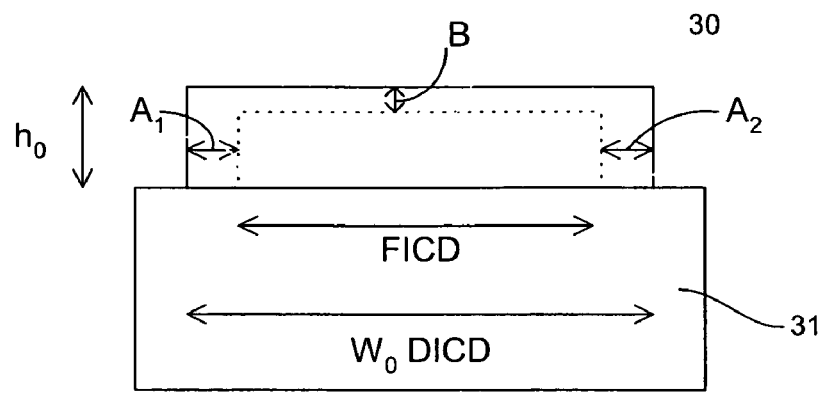
FIG. 5 is cross-sectional view of an exemplary semiconductor showing trim etch of the photoresist.

In the detailed description that follows, corresponding components have been given the same reference numerals, regardless of whether they are shown in different embodiments or views of the inventions described herein. As stated previously, in order to illustrate the various aspects of the inventions in a clear and concise manner, the drawings may not necessarily be to scale and certain features may be shown in somewhat schematic form.

The description herein is presented in the exemplary context of fabricating a wafer having an integrated circuit (IC) formed thereon. Example ICs include general purpose microprocessors and/or logic circuits made from thousands or millions of transistors, a flash memory array or any other dedicated circuitry. However, one of ordinary skill in the art will appreciate that the systems and processes described herein can also be applied to the fabrication of any article manufactured using photolithography, such as micromachines, disk drive heads, gene chips, micro electro-mechanical systems (MEMS) and so forth.

In general, the present invention is directed to a system and method using in situ scatterometry to detect defects in pattern integrity during the fabrication process. In particular, the present invention may be used to detect pattern integrity and prevent common photolithography problems, such as photoresist erosion, photoresist bending, undercutting, pattern collapse, and the like prior to the main etch of the wafer. If the in situ scatterometry measurements associated with a photoresist thickness of a wafer falls within an acceptable range of photoresist thickness, as determined by a characteristic (or target) trace, the next photolithography operation is performed on the wafer. However, if a pattern integrity defect is detected, the present invention allows for re-working or re-patterning of the wafer prior to the main etch process being performed thereon, thereby avoiding costly wafer scrapping.

As will be readily apparent to those of ordinary skill in the art upon a complete reading of the present application, the present system and method is applicable to a variety of technologies, e.g., NMOS, PMOS, CMOS, etc., and it is readily applicable to a variety of devices, including, but not limited to, logic devices, memory devices, etc.

Figure 6A:
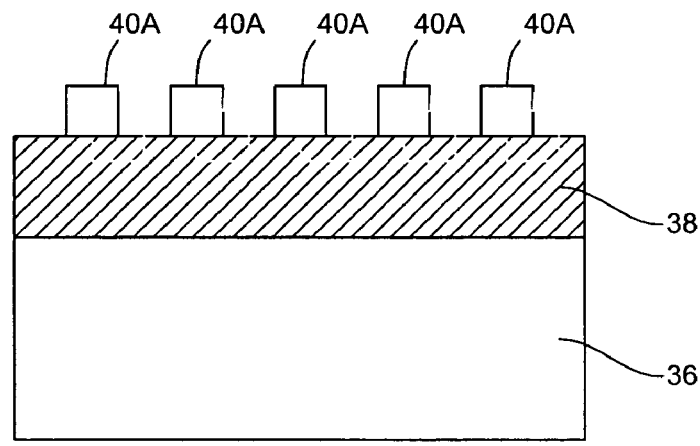
FIG. 6A is a cross-sectional view of an exemplary process layer having a layer of developed photoresist formed thereon.
Figure 6B:
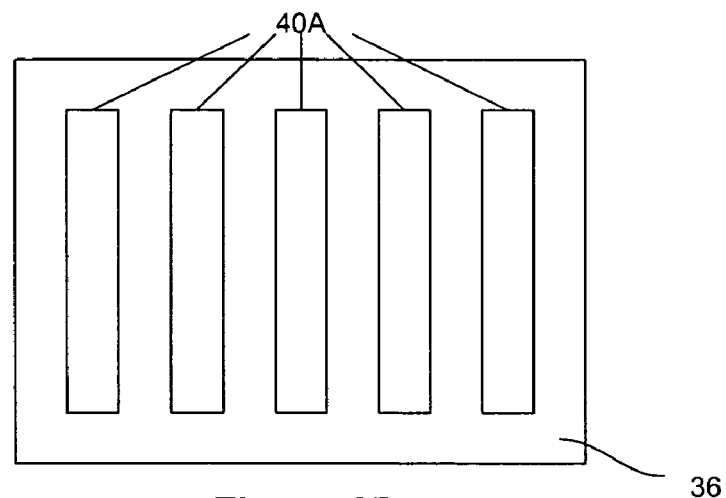
FIG. 6B is a top view of an exemplary process layer illustrating the gate channel formed.

The fabrication of semiconductors generally involves multiple processes whereby multiple layers of material are formed above a wafer body (or semiconducting substrate). Portions of those layers are selectively removed using known photolithography and etching techniques until such time as a completed device is formed. As discussed earlier, photolithography generally involves forming a patterned layer of photoresist material (positive or negative) above one or more layers of material that are desired to be patterned, and using the patterned photoresist layer as a mask in subsequent etching processes. For example, as shown in FIGS. 6A and 6B, a process layer 38 may be formed above a wafer 36 (or other previously-formed process layer), and a patterned layer of photoresist 40 is formed, as identified by the photoresist features 40A (also referred to herein as the patterned photoresist mask), above the process layer 38. By stating that the process layer 38 may be formed "above" the wafer 36, it should be understood that the process layer 38 may be formed on the wafer 36 as well as anywhere above one or more intervening layers.

In the context of the present invention, the process layer 38 is intended to be representative of any type of process layer that may be patterned in semiconductor fabrication operations. For example, the process layer 38 may be comprised of polysilicon, a metal, e.g., aluminum, or an insulating material having a dielectric constant less than 5.0, such as silicon dioxide, silicon oxynitride, etc. Further, the process layer 38 may be patterned or formed on a wafer 36 or over another process layer, e.g., a metal layer formed above a previously-formed layer of insulating material. Moreover, as will be clear to those skilled in the art, after a complete reading of this application, the present invention may be employed in a variety of situations encountered in semiconductor manufacturing. For example, the present invention may be employed in the context of forming gate electrode structures, conductive metal lines, openings in insulating layers, etc. Thus, the particular composition of the process layer 38 and the type of features formed in the process layer 38 should not be considered a limitation of the present invention unless such limitations are expressly set forth in the appended claims.

Figure 7:
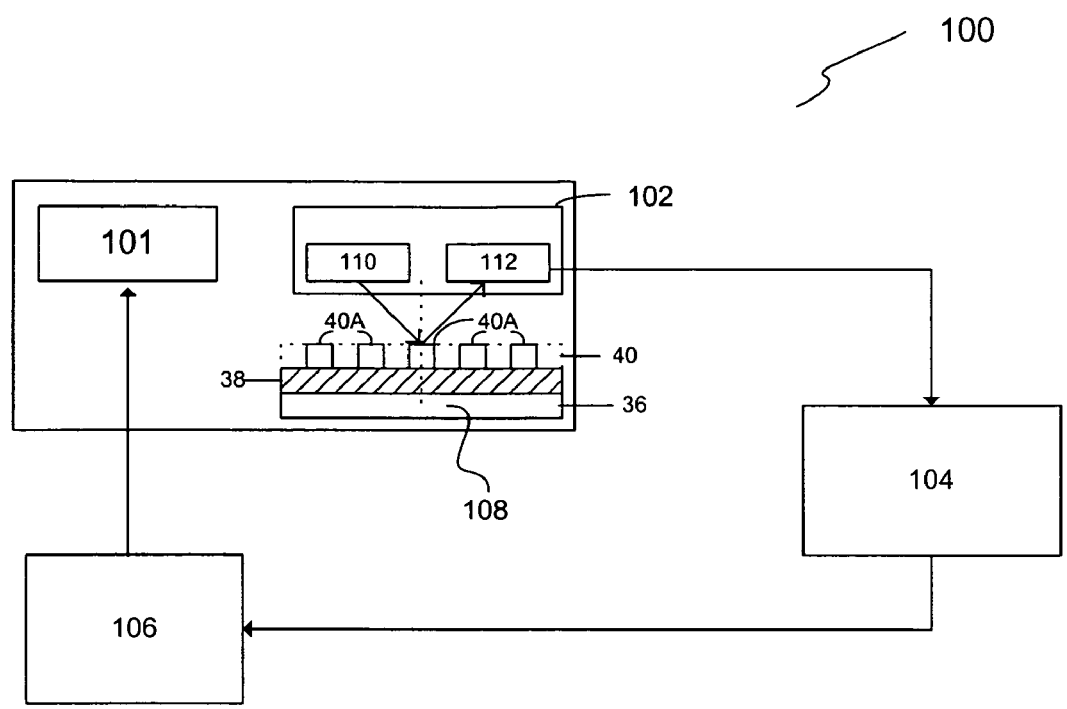
FIG. 7 depicts an exemplary system for practicing various aspects of the present invention.

An exemplary system that may be used to practice one or more aspects of the present invention is shown in FIG. 7. The system 100 is comprised of an etch chamber 114 that houses a photolithography tool 101 and a scatterometry tool 102. The system 100 further includes a computational tool 104 and a controller 106. The scatterometry tool 102 performs scatterometry measurements on a wafer 108. As shown in FIG. 7, the wafer 108 is positioned outside the scatterometry tool 102. One of ordinary skill in the art will readily appreciate that the wafer 108 may also be positioned within the scatterometry tool 102. Wafer 108 is representative of one or more wafers having a film stack comprised of at least one process layer 38 and a layer of photoresist 40 formed there above. The wafer 108 is depicted at the point in the photolithography process wherein the photoresist layer 40 has been deposited and developed resulting in photoresist features 40A.

A variety of scatterometry tools 102 may be used with the present invention, e.g., so-called 2E)-type systems, lens-type scatterometry tools, etc. The scatterometry tool 102 includes a light source 110 that may use white light, or some other wavelength or combination of wavelengths, depending on the specific implementation. Typically, the light source 110 will generate an incident beam that has a wide spectral composition and wherein the intensity of the light changes slowly in comparison to changes in wavelength. The angle of incidence of the light may also vary, depending on the specific implementation. The optical characteristic traces (also referred to herein as "target traces") generated by the scatterometry tool 102 may be based upon a comparison of light intensity to wavelength (for white light, fixed angle type scatterometry tools) or a comparison of intensity to incident angle (for angle resolved systems that use a single light source). Likewise, as discussed below, similar traces may be obtained for reflectance and phase depending on the detector used in the scatterometry system.

The scatterometry tool 102 further includes a detector 112. The detector 112 may be in the form of an ellipsometer or reflectometer. The detector 112 measures various parameters associated with the light diffracted from the surface of the wafer 108 (discussed below). In the case of an ellipsometer, the intensity and phase of the diffracted light is recorded as a function of wavelength. In the case of a reflectometer, the reflectance is measured. Additionally, the light source 110 and the detector 112 may be arranged in variety of ways, including in concentric circle configuration, with the light source 110 illuminating the wafer 108 from a perpendicular orientation, e.g., a reflectometer. Likewise, the intensity of the reflected light may be measured as s- and p-polarization over either multiple angles or at multiple wavelengths.

The scatterometry tool 102 also includes a data processing unit (not shown) loaded with a scatterometry software application for processing data collected by the optical hardware. The data processing unit may be implemented within the scatterometry tool 102 or the data processing unit may be implemented in the computational unit 104.

The computational unit 104 receives diffraction data from the detector 112. The computational unit 104 may be a computer or other electronic device. Based on the results on the diffraction data received, the computational unit 104 transmits a control signal to the controller 106. The controller 106 controls at least a portion of the controllable parameters associated with the photolithography tool 101 (e.g., the exposure dose of a stepper exposure process, the focus of the stepper exposure process, the duration of the subsequent development process, post exposure bake time and/or temperature, etc.).

Through use of scatterometry, an optical characteristic trace associated with an acceptable level of photoresist thickness or other characteristic may be obtained. These traces may be stored in a variety of manners, including a local cache, RAM, an electronic storage device or an electronic database or library of traces. The calculated scatterometry trace may be based on a variety of characteristics of the patterned photoresist mask (depicted as 40A in FIG. 7). In one aspect of the present invention, the optical characteristic trace may be based upon an acceptable thickness of the developed patterned photoresist mask. In another aspect of the present invention, the optical characteristic trace may be based upon detecting a defect in the pattern integrity associated with the patterned photoresist mask. Other characteristics or combinations of characteristics may also be used as the basis for obtaining the optical characteristic traces.

Variations in the amount of photoresist material and the associated profile degradations in the photoresist layer 40 will cause one or more of the optical characteristics to vary (e.g., varying thickness or a defect in the photoresist layer 40). In turn, this will cause a significant change in the diffraction characteristics of the incident light from the light source 110 of the scatterometry tool 102 (e.g., the intensity, phase, and/or reflectance will vary greatly from acceptable characteristic data. Thus, using Maxwell's equations, a unique optical characteristic trace may be established for a variety of anticipated situations reflecting desired photoresist characteristics. A series of traces corresponding to an acceptable thickness of photoresist may be calculated, measured and/or arrived at empirically and stored in a library or other retrievable manner. Through this technique, each trace in the library represents a characteristic of the patterned photoresist mask having a permissible variation of a specific characteristic (e.g., thickness or pattern integrity) associated with the patterned photoresist mask of the wafer 108.

A scatterometry measurement is made by the light source 110 emitting an incident light beam at an angle θ with respect to a normal to the surface of the wafer 108 as shown in FIG. 7. The light source 110 may be a laser, for example, or a broad spectral range source such as a lamp. Light is scattered from the surface of the wafer 108 and the scattering light scattered at an angle θ with respect to a normal to the surface of the wafer 108, is detected by detector 112. One of ordinary skill in the art will readily appreciate that during a scatterometry measurement, the angle θ (and correspondingly the angle −θ) may be scanned across a range of values. This may be accomplished, for example, by changing the relative position and/or orientation of the light source, light detector, and wafer 108. Alternatively the angle θ may remain fixed and the light detector may provide an intensity for a range of light wavelengths.

The scatterometry data measured from the diffracted light may be dependent on the detector 112. For example, a scatterometry tool 102 employing a reflectometer will record reflectance as a function of wavelength. Likewise, a scatterometry tool 102 utilizing an ellipsometer will measure intensity and phase as a function of wavelength.

Upon performing a scatterometry measurement, the diffraction data is transmitted to the computational unit 104. In one aspect of the invention, the computational unit 104 provides a prediction of the thickness of the photoresist layer 40 by comparing the diffraction data with a diffraction data model, which is derived from the characteristic traces discussed above. The computational tool 104 compares the measured trace (i.e., individual or averaged) to a target or reference trace or a library of traces with acceptable degrees of pattern integrity to determine if the current measured trace falls within a suitable range. One of ordinary skill in the art will readily appreciate that there are any number of factors that may be used to base the range of target or reference traces or library of traces. For example, one such example is based upon the thickness of the patterned photoresist mask after development. Likewise, one of ordinary skill in the art should appreciate that the function of the computational tool 104 may also be accomplished by the scatterometry tool 102 (or some other computation tool resident within the manufacturing plant). When the comparison is performed, the scatterometry tool 102, computational tool 104, or controller 106 may then provide data as to the thickness of photoresist layer 40 to the photolithography tool 101.

Based upon this comparison, computational tool 104 transmits a control signal to the controller 106. The control signal may direct the process controller 106 to take a variety steps. For example, if the comparison of the measured diffraction data with the data model of target or reference traces or library of traces indicates the presence of a defect, such as photoresist erosion, photoresist bending or pattern collapse, the photolithography process may be discontinued and the wafer 108 may be sent to be re-worked or re-patterned. By way of example, it may be the case that the light source (not shown) within the stepper has gradually degraded over time to the point that it no longer provides the same exposure dose, even though settings on the stepper tool indicate that it should. In this situation, the light source may be replaced prior to performing additional exposures processes on additional wafers. Likewise, if a defect in the photoresist is detected, the process controller may send the wafer 108 to be re-worked or re-patterned. This avoids scrapping of the entire wafer.

Additionally, based upon the determined thickness or pattern integrity associated with the patterned photoresist mask, the controller 106 may adjust one or more parameters of the photolithography tool 101 used to form a patterned layer of photoresist 40 (e.g., correct the detected problem, and repeat the photolithographic process on the given wafer or correct the detected problem on subsequently processed wafers). Furthermore, the results of the scatterometric measurement may be fed back to the controller 106. In turn, the controller 106 may modify or determine one or more process parameters for forming a patterned layer of photoresist above on the current or a subsequently processed wafer. Various parameters may be controlled using the present techniques, e.g., the exposure dose of a stepper exposure process, the focus of the stepper exposure process, the duration of the subsequent development process, post exposure bake time and/or temperature, etc. A variety of other parameters or combination of parameters may also be varied.

In the illustrated embodiments, the computational tool 104 and the controller 106 are physically housed in a computer programmed with software to implement the functions described herein. However, one of ordinary skill in the art would readily appreciate that the operations performed by the computation tool 104 and controller 106 may be implemented in hardware as well as software. Moreover, the operations performed by the controller 106 may be performed by one or more controllers located throughout the system. For example, the controller 106 may be a fabrication level controller that is used to control processing operations throughout all or a portion of a semiconductor manufacturing facility. Alternatively, the controller 106 may be a lower level computer that controls only portions or cells of the manufacturing facility. Moreover, the controller 106 may be a stand-alone device, or it may reside as part of the photolithography system. However, as will be appreciated by those of ordinary skill in the art, a hardware controller (not shown) designed to implement the particular functions may also be used.

Figure 8:
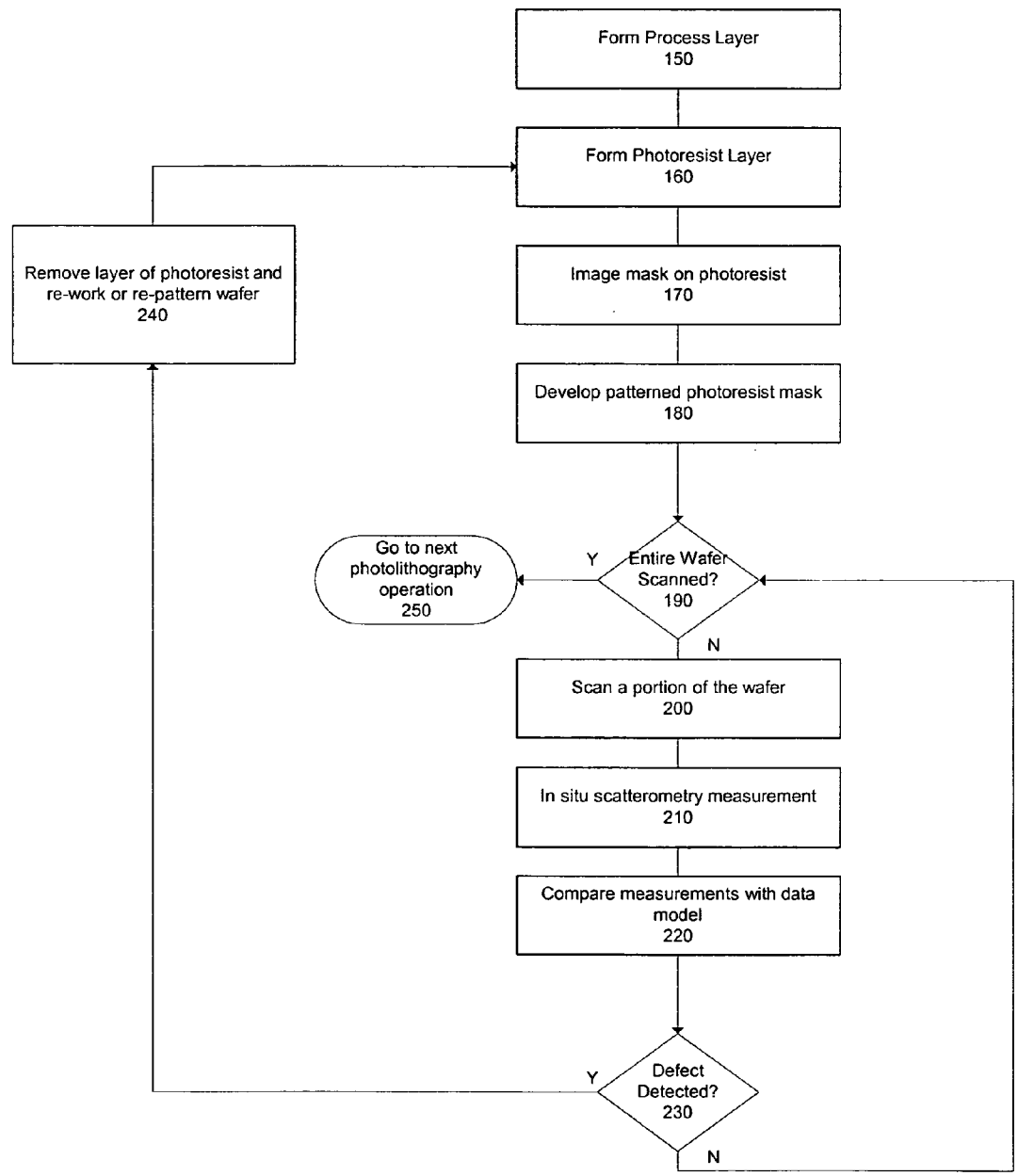
FIG. 8 is a block diagram illustrating a method in accordance with the present invention.

FIG. 8 illustrates a method in accordance with the present invention. A process layer is formed above a wafer, as depicted by block 150. A layer of photoresist is formed above process layer, as depicted by block 160. In block 170, a photomask is imaged and exposed on the layer of photoresist, the layer of photoresist is developed, as depicted on block 180. A section of the wafer is scanned and measured using in situ scatterometry, depicted by process blocks 200 and 210, respectively. The measured traces are then compared to target or reference traces or a library of traces, as depicted in process block 220. If a defect is detected, the wafer is sent for re-working or re-patterning, as depicted by process block 240. If no defect is detected, another section of the wafer is scanned and tested, as depicted by process block path 230, 190, 200, 210, and 220. This process continues until either a defect has been detected and the wafer is sent for re-working or re-patterning or the entire wafer has been scanned and no defect was detected.

As one of ordinary skill in the art will appreciate, the example system and method described herein can be modified. For example, certain steps can be omitted, certain steps can be carried out concurrently, and other steps can be added. Although particular embodiments of the invention have been described in detail, it is understood that the invention is not limited correspondingly in scope, but includes all changes, modifications and equivalents coming within the spirit and terms of the claims appended hereto.

What is claimed is:

1. A method of forming a semiconductor device, the method comprising:
   (a) forming a process layer above a wafer body;
   (b) forming a layer of photoresist above the process layer;
   (c) imaging the layer of photoresist with a patterned mask;
   (d) exposing the layer of photoresist to leave an impression of the patterned mask on the layer of photoresist;
   (e) developing the layer of photoresist to form a patterned photoresist mask;
   (f) determining a thickness of the patterned photoresist mask by performing an in situ scatterometry measurement on at least a portion of the patterned photoresist mask; and
   (g) if the thickness of the patterned photoresist mask is insufficient, removing the patterned photoresist mask and repeating steps (a)–(g).

2. The method of claim 1, wherein the defect includes at least one of photoresist erosion, photoresist bending and pattern collapse.

3. The method of claim 1, further comprising:
   modifying at least one parameter of a photolithography process used to form the patterned photoresist mask based upon detecting the defect.

4. The method of claim 3, wherein modifying at least one parameter of the photolithography process used to form the patterned photoresist mask includes modifying at least one of a stepper exposure dose, a stepper focus, and a duration of a photoresist development process.

5. The method of claim 1 wherein the model of diffraction data is based upon a suitable thickness of the patterned photoresist mask.

6. The method of claim 1, wherein at least a portion of the model of diffraction data is stored in an electronic library.

7. The method of claim 1 wherein at least a portion of the model of diffraction data is stored in random access memory.

8. The method of claim 1, wherein step (f) includes:
collecting measurement diffraction data from the in situ scatterometry measurement; and
comparing the measurement diffraction data to one or more diffraction data models, the diffraction data models being indicative of photoresist mask thickness.

9. A method of forming a semiconductor device, the method comprising:
forming a process layer above a wafer body;
forming a photoresist layer above the process layer;
patterning the photoresist layer according to a mask, the patterning providing features in the photoresist layer having a lateral dimension;
performing a trim etch process on the patterned photoresist layer, the trim etch process reducing the lateral dimension of features of the patterned photoresist layer;
after the trim etch process, performing an in situ scatterometry measurement to determine whether the trim etch process caused defects in the patterned photoresist layer;
if defects are detected in the trim-etched photoresist layer, removing the trim-etched photoresist layer;
providing a new photoresist layer;
patterning the new photoresist layer; and
performing a modified trim-etch process on the patterned new photoresist layer, the modified trim-etch process, the modified trim etch process being modified to avoid the previously detected defects.

10. In a method of manufacturing a plurality of semiconductor devices in which at least one process layer is formed above a semiconductor wafer body, the formation of the process layer including providing a photoresist layer above the process layer, patterning the photoresist layer according to a mask, and performing a trim etch process on the patterned photoresist layer, a method of reducing waste of the semiconductor wafer body, the method comprising:
after the trim etch process, performing an in situ scatterometry measurement to determining the thickness of the trim-etched photoresist layer;
if the thickness of the trim-etched photoresist layer is below a predetermined threshold, removing the trim-etched photoresist layer;
providing a new photoresist layer; and
patterning the new photoresist layer.

11. The method of claim 10, further comprising:
if the thickness of the trim-etched photoresist layer is below the predetermined threshold, modifying at least one parameter of a photolithography process used to pattern the new photoresist layer.

12. The method of claim 11, wherein modifying at least one parameter of the photolithography process used to pattern the new photoresist layer includes modifying at least one of a stepper exposure dose, a stepper focus, and a duration of a photoresist development process.

* * * * *

UNITED STATES PATENT AND TRADEMARK OFFICE
CERTIFICATE OF CORRECTION

PATENT NO.         : 7,052,921 B1
APPLICATION NO. : 10/934192
DATED                 : May 30, 2006
INVENTOR(S)        : Plat et al.

It is certified that error appears in the above-identified patent and that said Letters Patent is hereby corrected as shown below:

Column 3, line 59, replace "dimensions typically-down to " with --dimensions typically down to--.

Column 7, line 20, replace "so-called 2E)-type systems" with --so-called 2Θ-type systems--.

Signed and Sealed this

Twenty-ninth Day of August, 2006

JON W. DUDAS
*Director of the United States Patent and Trademark Office*